United States Patent
Kim et al.

(10) Patent No.: US 7,948,263 B2
(45) Date of Patent: May 24, 2011

(54) POWER GATING CIRCUIT AND INTEGRATED CIRCUIT INCLUDING SAME

(75) Inventors: Hyung-Ock Kim, Seoul (KR); Jung-Yun Choi, Gyeonggi-do (KR); Bong-Hyun Lee, Gyeonggi-do (KR); Mun-Jun Seo, Daejeon (KR); Youngsoo Shin, Daejeon (KR)

(73) Assignees: Samsung Electronics Co., Ltd., Gyeonggi-do (KR); Korea Advanced Institute of Science and Technology, Daejeong (KR)

(*) Notice: Subject to any disclaimer, the term of this patent is extended or adjusted under 35 U.S.C. 154(b) by 0 days.

(21) Appl. No.: 12/719,472

(22) Filed: Mar. 8, 2010

(65) Prior Publication Data

US 2010/0231255 A1 Sep. 16, 2010

(30) Foreign Application Priority Data

Mar. 13, 2009 (KR) .................. 10-2009-0021678

(51) Int. Cl.
*H03K 17/16* (2006.01)
*H03K 19/003* (2006.01)

(52) U.S. Cl. ........... 326/33; 326/112; 326/119; 326/121
(58) Field of Classification Search .................. None
See application file for complete search history.

(56) References Cited

U.S. PATENT DOCUMENTS

| 6,788,122 B2 * | 9/2004 | Jones, Jr. ................. 327/202 |
| 7,649,393 B2 * | 1/2010 | Maeda ..................... 327/198 |
| 2008/0106299 A1 | 5/2008 | Oh | |

FOREIGN PATENT DOCUMENTS

| JP | 2005-268694 | 9/2005 |
| JP | 2006-042304 | 2/2006 |
| KR | 10-0734328 | 6/2007 |

* cited by examiner

*Primary Examiner* — Anh Q Tran
(74) *Attorney, Agent, or Firm* — Myers Bigel Sibley & Sajovec, P.A.

(57) ABSTRACT

A power gating circuit includes a logic circuit, a switching element and a retention flip-flop. The logic circuit is coupled between a first power rail and a virtual power rail. The switching element selectively couples the virtual power rail to a second power rail in response to a mode control signal indicating an active mode or a standby mode. The retention flip-flop selectively performs a flip-flop operation or a data retention operation in response to a voltage of the virtual power rail.

18 Claims, 8 Drawing Sheets

FIG. 11

| | WIRE LENGTH | | |
|---|---|---|---|
| | CONVENTIONAL (mm) | PRESENT (mm) | REDUCTION RATE (%) |
| S35932 | 155 | 147.1 | 5.1 |
| S38417 | 126.7 | 116 | 8.5 |
| S38584 | 153.5 | 146 | 4.9 |
| B12 | 13.1 | 11.4 | 12.7 |
| B13 | 3.8 | 3.3 | 13.6 |
| AES1 | 26.8 | 24.9 | 7.3 |
| IRDA1 | 3 | 2.8 | 6.4 |
| IRDA2 | 10.9 | 10.1 | 7.6 |
| IRDA3 | 2.3 | 2 | 12.5 |
| I2C1 | 5 | 4.2 | 15.4 |
| MC1 | 2.6 | 2.3 | 10.5 |
| MC2 | 7.5 | 7.1 | 5.6 |
| RAM1 | 97.7 | 93 | 4.8 |
| RNG | 6.7 | 5.9 | 11.2 |
| WB1 | 46.7 | 45.1 | 3.3 |
| AVERAGE | - | - | 8.6 |

POWER GATING CIRCUIT AND INTEGRATED CIRCUIT INCLUDING SAME

REFERENCE TO PRIORITY APPLICATION

This application claims priority to Korean Patent Application No. 2009-0021678, filed Mar. 13, 2009, the contents of which are hereby incorporated herein in its entirety.

FIELD OF THE INVENTION

This invention relates to integrated circuits and, more particularly, to power gating circuits and integrated circuits including power gating circuits.

BACKGROUND

A power gating circuit is widely used to reduce power consumption in an integrated circuit. The power gating circuit controls application of power supply voltages to circuits to reduce the power consumption.

In a conventional integrated circuit, the overall wire length increases due to wires through which a mode control signal is transmitted to control the power gating circuit.

SUMMARY

Example embodiments provide a power gating circuit and an integrated circuit including the power gating circuit for reducing a wire length by using a voltage of a virtual power rail as a mode control signal.

According to some example embodiments, an integrated circuit device includes a logic circuit, a switching circuit and a data retention circuit.

The logic circuit is electrically coupled to a first power rail and a virtual power rail. The switching circuit is electrically coupled to the virtual power rail and a second power rail. The switching circuit electrically couples the virtual power rail to the second power rail to thereby power said logic circuit during an active mode of operation, and electrically decouples the virtual power rail from the second power rail to thereby disable said logic circuit during a standby mode of operation. The data retention circuit is electrically coupled to an output of said logic circuit. The data retention circuit latches data received from the output of said logic circuit during the active mode of operation, and holds previously latched data therein during the standby mode of operation while concurrently blocking changes in the output of said logic circuit from becoming latched therein.

In some embodiments, the data retention circuit may be electrically connected to the first power rail, the virtual power rail and the second power rail.

In some embodiments, the data retention circuit may generate an internal clock signal in response to a voltage of the virtual power rail received at a control input thereon.

In some embodiments, the data retention circuit may clamp the internal clock signal at a first logic level during the standby mode of operation.

In some embodiments, the data retention circuit may include at least one inverter therein having a first power supply terminal electrically connected to the first power rail and a second power supply terminal electrically connected to the virtual power rail.

According to some example embodiments, a power gating circuit includes a logic circuit, a switching element and a retention flip-flop.

The logic circuit is coupled between a first power rail and a virtual power rail. The switching element selectively couples the virtual power rail to a second power rail in response to a mode control signal indicating an active mode or a standby mode. The retention flip-flop configured to selectively perform a flip-flop operation or a data retention operation in response to a voltage of the virtual power rail.

In some embodiments, the switching element may connect the virtual power rail to the second power rail when the mode control signal indicates the active mode, and may disconnect the virtual power rail from the second power rail when the mode control signal indicates the standby mode.

In some embodiments, the first power rail may be a power supply rail, the second power rail may be a ground rail, and the switching element may be a footer.

In other embodiments, the first power rail may be a ground rail, the second power rail may be a power supply rail, and the switching element may be a header.

In some embodiments, the retention flip-flop may perform the flip-flop operation when the voltage of the virtual power rail is substantially the same as a second power supply voltage provided through the second power rail, and the retention flip-flop may perform the data retention operation when the voltage of the virtual power rail is substantially the same as a first power supply voltage provided through the first power rail.

In some embodiments, the retention flip-flop may include a control signal input unit configured to receive the voltage of the virtual power rail, and configured to generate a mode signal based on the voltage of the virtual power rail, a clock signal input unit configured to receive a clock signal, and configured to selectively output the clock signal as an internal clock signal in response to the mode signal, a flip-flop unit configured to perform the flip-flop operation when the clock signal input unit outputs the internal clock signal, and a data retention unit configured to perform the data retention operation when the clock signal input unit does not output the internal clock signal.

In some embodiments, the control signal input unit may include a first inverter configured to invert the voltage of the virtual power rail, and a second inverter configured to invert an output of the first inverter, and configured to output the inverted output as the mode signal.

In some embodiments, the first inverter may include first and second PMOS transistors coupled in series between the first power rail and an output node, and first and second NMOS transistors coupled in series between the output node and the second power rail.

In some embodiments, the clock signal input unit may include a first inverter coupled between the first power rail and the virtual power rail, and configured to invert the clock signal, a second inverter coupled between the first power rail and the virtual power rail, configured to invert an output of the first inverter, and configured to output the inverted output as the internal clock signal at a node, and an NMOS transistor configured to selectively couple the node to the second power rail in response to the mode signal.

In some embodiments, the flip-flop unit may be coupled between the first power rail and the virtual power rail, and the data retention unit may be coupled between the first power rail and the second power rail.

In some embodiments, the flip-flop unit may be not supplied with power and the data retention unit may be supplied with the power when the voltage of the virtual power rail is substantially the same as a first power supply voltage provided through the first power rail.

In some embodiments, the power gating circuit may further include a voltage level transition circuit configured to couple the virtual power rail to the first power rail during a predetermined time in response to the mode control signal when the mode control signal transitions from a first logic level indicating the active mode to a second logic level indicating the standby mode.

In some embodiments, the voltage level transition circuit may include a pulse generator configured to generate a pulse having a width corresponding to the predetermined time in response to the mode control signal, and a charge pump switching element configured to couple the virtual power rail to the first power rail in response to the pulse generated by the pulse generator.

In some embodiments, the pulse generator may include a delay unit configured to delay the mode control signal, and a logic gate configured to generate the pulse by performing a logical operation on the mode control signal and the delayed mode control signal.

In some embodiments, the width of the pulse may be adjusted based on an amount of charges that are required for the voltage of the virtual power rail to reach a first power supply voltage provided through the first power rail.

In some embodiments, the power gating circuit may further include an output isolation circuit configured to selectively perform a data output operation or the data retention operation in response to the voltage of the virtual power rail In some embodiments, the output isolation circuit may perform the data output operation when the voltage of the virtual power rail is substantially the same as a second power supply voltage provided through the second power rail, and the output isolation circuit may perform the data retention operation when the voltage of the virtual power rail is substantially the same as a first power supply voltage provided through the first power rail.

In some embodiments, the output isolation circuit may include a control signal input unit configured to receive the voltage of the virtual power rail, and configured to generate a mode signal based on the voltage of the virtual power rail, a data output unit configured to perform the data output operation in response to the mode signal, and a data retention unit configured to perform the data retention operation in response to the mode signal.

In some embodiments, the control signal input unit may include a first inverter and a second inverter, and the first inverter may include first and second PMOS transistors coupled in series between the first power rail and an output node, and an NMOS transistor coupled between the output node and the second power rail.

According to some example embodiments, an integrated circuit a first power rail configured to provide a first power supply voltage, a second power rail configured to provide a second power supply voltage, a virtual power rail, a power management unit configured to generate a mode control signal, and the power gating circuit.

According to some example embodiments, the power gating circuit and the integrated circuit may reduce a wire length by using a voltage of a virtual power rail as a mode control signal. Further, according to some example embodiments, the power gating circuit and the integrated may reduce leakage current and power consumption.

BRIEF DESCRIPTION OF THE DRAWINGS

FIG. 11 is a diagram illustrating simulation results for a power gating circuit according to some example embodiments.

DETAILED DESCRIPTION OF THE EMBODIMENTS

Figure 1:
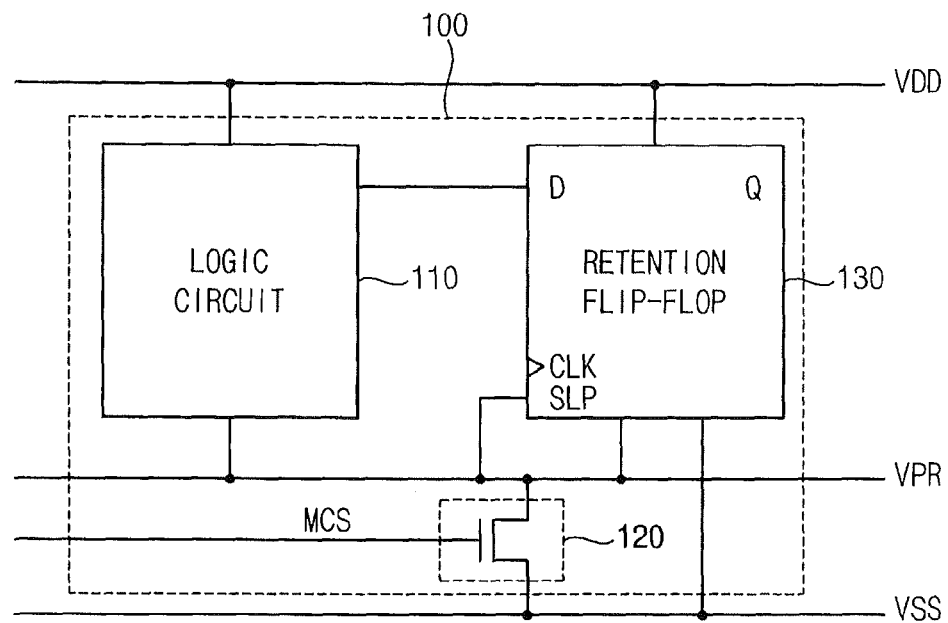
FIG. 1 is a block diagram illustrating a power gating circuit according to some example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of elements may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a power gating circuit according to some example embodiments.

Referring to FIG. 1, a power gating circuit 100 includes a logic circuit 110, a switching element 120 and a retention flip-flop 130.

The logic circuit 110 may perform predetermined logic operations. The logic circuit 110 may be a combinational logic circuit that does not store status information. The logic circuit 110 may be coupled between a first power rail VDD and a virtual power rail VPR. In an active mode, a voltage of the virtual power rail VPR may be substantially the same as a second power supply voltage provided through a second power rail VSS. That is, the voltage of the virtual power rail VPR may have a voltage level close to that of the second power supply voltage. Thus, in the active mode, the logic circuit 110 may be supplied with power by the first power rail VDD and the virtual power rail VPR, and may perform the logic operations. In a standby mode, the voltage of the virtual power rail VPR may be substantially the same as a first power supply voltage provided through a first power rail VDD. That is, the voltage of the virtual power rail VPR may have a voltage level close to that of the first power supply voltage. Thus, in the standby mode, since the first power rail VDD and the virtual power rail VPR may have substantially the same voltage level, the logic circuit 110 may be not supplied with the power. Accordingly, leakage current and power consumption may be reduced.

The switching element 120 may selectively couple the virtual power rail VPR to the second power rail VSS in response to a mode control signal MCS. The switching element 120 may receive the mode control signal MCS from a power management unit (not shown). The mode control signal MCS may indicate the active mode or the standby mode.

For example, if the mode control signal MCS has a logic high level indicating the active mode, the switching element 120 may connect the virtual power rail VPR to the second power rail VSS. In this case, the voltage of the virtual power rail VPR may become substantially the same as the second power supply voltage of the second power rail VSS. That is, the virtual power rail VPR may provide a power supply voltage having a voltage level close to that of the second power supply voltage.

If the mode control signal MCS has a logic low level indicating the standby mode, the switching element 120 may disconnect the virtual power rail VPR from the second power rail VSS. In this case, the virtual power rail VPR may be floated. In general, a size of the switching element 120 may be smaller than that of the logic circuit 110, and thus an impedance of the switching element 120 may be higher than that of the logic circuit 110. Accordingly, the voltage of the floated virtual power rail VPR may become substantially the same as the first power supply voltage of the first power rail VDD. As described above, the switching element 120 may adjust the voltage of the virtual power rail VPR close to the first power supply voltage or the second power supply voltage by selectively coupling the virtual power rail VPR to the second power rail VSS in response to the mode control signal MCS.

The retention flip-flop 130 may have a data input terminal D, a data output terminal Q, a clock input terminal CLK and a control input terminal SLP. The retention flip-flop 130 may receive data provided from the logic circuit 110 at the data input terminal D, and may output the received data at the data output terminal Q. The retention flip-flop 130 may receive a clock signal provided from an external circuit at the clock input terminal CLK.

The retention flip-flop 130 may receive the voltage of the virtual power rail VPR as a control signal at the control input terminal SLP. Operations of the retention flip-flop 130 may be controlled in response to the voltage of the virtual power rail VPR. The retention flip-flop 130 may perform a flip-flop operation in the active mode and may perform a data retention operation in the standby mode in response to the voltage of the virtual power rail VPR. For example, if the voltage of the virtual power rail VPR is substantially the same as the second power supply voltage of the second power rail VSS, the retention flip-flop 130 may perform the flip-flop operation that outputs the data provided from the logic circuit 110 in response to the clock signal. If the voltage of the virtual power rail VPR is substantially the same as the first power supply voltage of the first power rail VDD, the retention flip-flop 130 may perform the data retention operation that maintains the data provided from the logic circuit 110.

As described above, the power gating circuit 100 according to some example embodiments may not supply the power to the logic circuit 110 in the standby mode, thereby reducing the leakage current and the power consumption. In the power gating circuit 100 according to some example embodiments, since the retention flip-flop 130 may maintain the data in the standby mode, an initialization operation may not be required when an operation mode transitions from the standby mode to the active mode. Further, in the power gating circuit 100 according to some example embodiments, since the retention flip-flop 130 receives the voltage of the virtual power rail VPR at the control input terminal SLP, wires through which a control signal for the retention flip-flop 130 is transmitted may not be required, thereby reducing a wire length and wiring congestion.

While the switching element 120 is illustrated in FIG. 1 as a footer, in some embodiments, the switching element 120 may be implemented as a header. In case that the switching element 120 is the header, the virtual power rail VPR may be selectively coupled to the first power rail VDD. In this case, the voltage of the virtual power rail VPR may be substantially the same as the first power supply voltage in the active mode, and may be substantially the same as the second power supply voltage in the standby mode. The power gating circuit 100 including the header may reduce the wire length and the wiring congestion.

Figure 2:
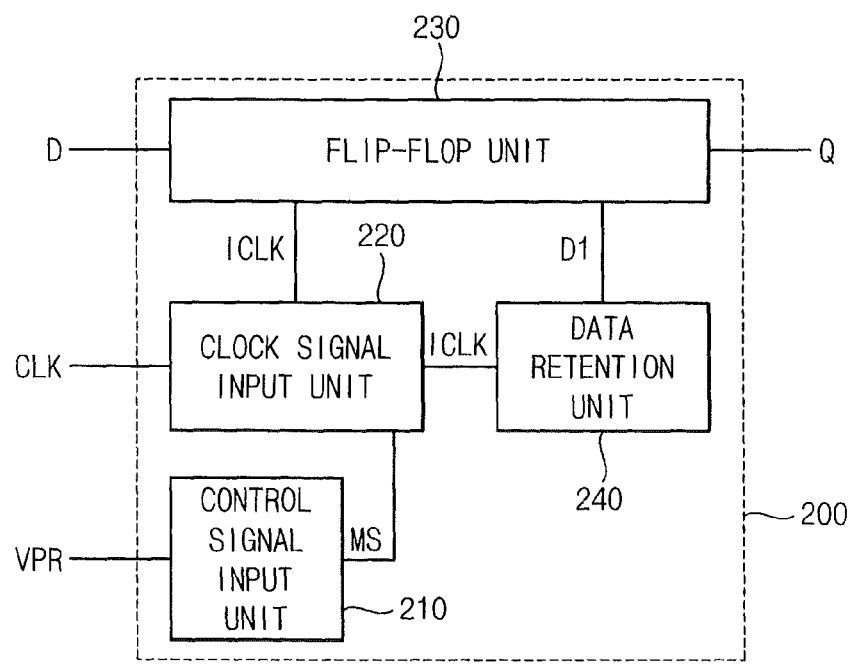
FIG. 2 is a block diagram illustrating a retention flip-flop included in a power gating circuit of FIG. 1.

FIG. 2 is a block diagram illustrating a retention flip-flop included in a power gating circuit of FIG. 1.

Referring to FIG. 2, a retention flip-flop 200 includes a control signal input unit 210, a clock signal input unit 220, a flip-flop unit 230 and a data retention unit 240. The retention flip-flop 200 may be the retention flip-flop 130 included in the power gating circuit 100 of FIG. 1.

The control signal input unit 210 may receive a voltage of a virtual power rail VPR as a control signal. For example, the control signal input unit 210 may receive the voltage having a logic low level in an active mode, and may receive the voltage having a logic high level in a standby mode. The control signal input unit 210 may generate a mode signal MS based on the voltage of the virtual power rail VPR. The mode signal MS may have substantially the same logic level as the voltage of the virtual power rail VPR. For example, if the voltage of the virtual power rail VPR has the logic low level, the mode signal MS may have the logic low level. If the voltage of the virtual power rail VPR has the logic high level, the mode signal MS may have the logic high level. In some embodiments, the retention flip-flop 200 may be implemented without the control signal input unit 210, and the voltage of the virtual power rail VPR may be directly applied to the clock signal input unit 220.

The clock signal input unit 220 may receive a clock signal CLK from an external clock generator, and may selectively output the clock signal CLK as an internal clock signal ICLK in response to the mode signal MS. For example, when the mode signal MS has a logic low level, the clock signal input unit 220 may output the internal clock signal ICLK. When the mode signal MS has a logic high level, the clock signal input unit 220 may not output the internal clock signal ICLK.

The flip-flop unit 230 may temporarily store input data D and may output the stored data as output data Q in response to the internal clock signal ICLK. The input data D may be data provided from a logic circuit 110 of FIG. 1. In the active mode, the flip-flop unit 230 may receive the internal clock signal ICLK from the clock input unit 220, and may perform a flip-flop operation. In the standby mode, the clock input unit 220 may not provide the internal clock signal ICLK to the flip-flop unit 230, and the flip-flop unit 230 may not perform the flip-flop operation. In some embodiments, the flip-flop unit 230 may be coupled between a first power rail and the virtual power rail VPR. When the voltage of the virtual power rail VPR is substantially the same as a first power supply voltage of the first power rail (i.e., in the standby mode), the power may not be supplied to the flip-flop unit 230 and the flip-flop unit 230 may not operate.

The data retention unit 240 may maintain the data that are temporarily stored in the flip-flop unit 230 in the standby mode. When the clock signal input unit 220 does not output the internal clock signal ICLK to the data retention unit 240 (i.e., in the standby mode), the data retention unit 240 may perform a data retention operation that maintains the data. In some embodiments, the data retention unit 240 may be coupled between the first power rail and the second power rail. Thus, the data retention unit 240 may be supplied with the power and may operate in the standby mode.

In some embodiments, the data retention unit 240 may operate in response to logic levels of the internal clock signal ICLK provided from the clock signal input unit 220. For example, when the internal clock signal ICLK has a logic high level, the data retention unit 240 may read the data temporarily stored in the flip-flop unit 230, and may maintain the read data. During the standby mode, the internal clock signal ICLK may be deactivated and may have a logic low level, and the data retention unit 240 may perform the data retention operation in response to the deactivated internal clock signal ICLK. The data retention unit 240 may perform the data retention operation until the operation mode transitions from the standby mode to the active mode.

As described above, the retention flip-flop receives the voltage of the virtual power rail VPR as the control signal, and a power gating circuit according to some example embodiments may reduce a wire length for the control signal.

Figure 3:
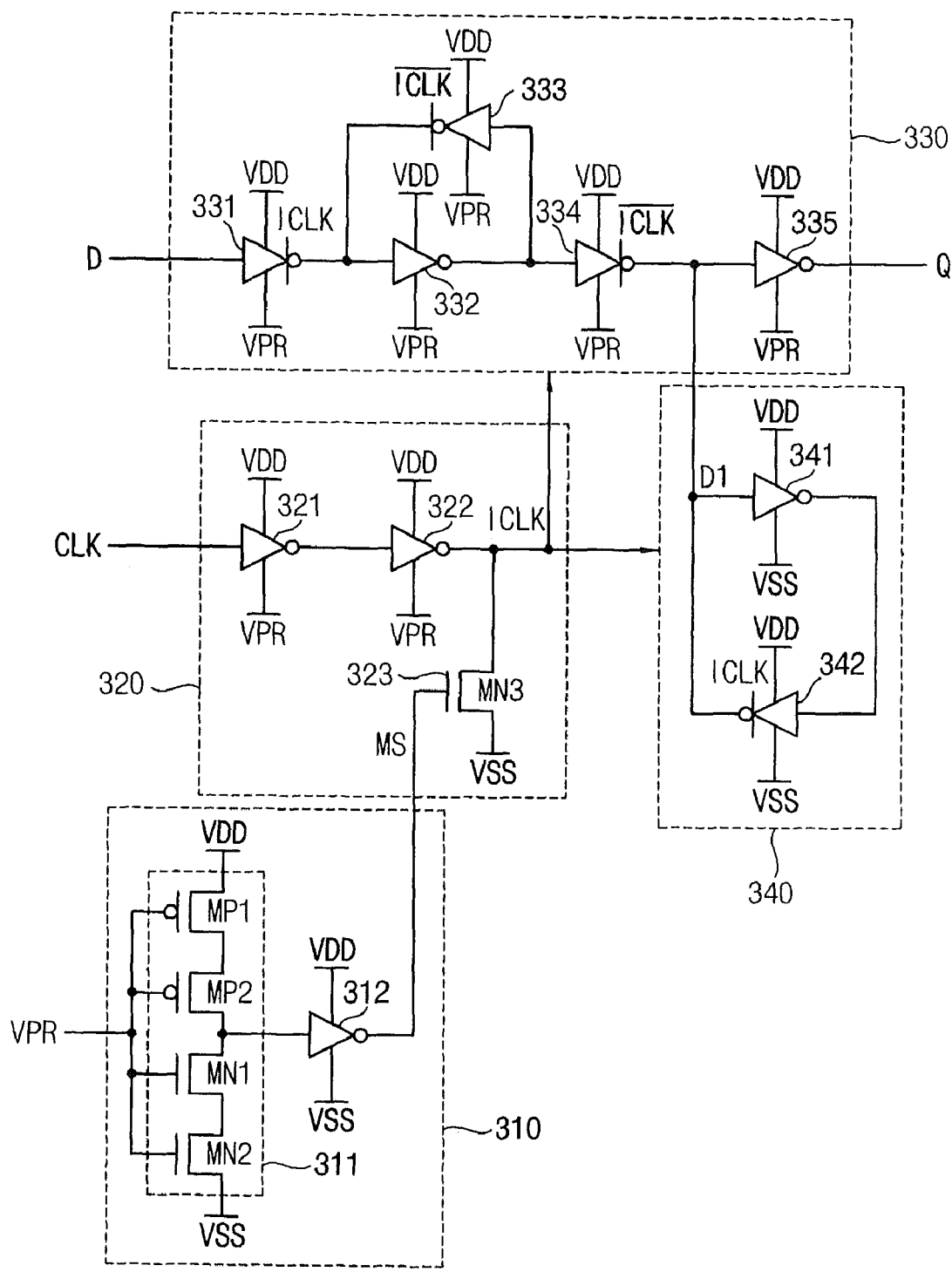
FIG. 3 is a circuit diagram illustrating an example of a retention flip-flop of FIG. 2.

FIG. 3 is a circuit diagram illustrating an example of a retention flip-flop of FIG. 2.

Referring to FIG. 3, a retention flip-flop 300 includes a control signal input unit 310, a clock signal input unit 320, a flip-flop unit 330 and a data retention unit 340. The retention flip-flop 300 may be a retention flip-flop 130 illustrated in FIG. 1 or a retention flip-flop 200 illustrated in FIG. 2.

The control signal input unit 310 may include a first inverter 311 and a second inverter 312. The first inverter 311 may invert a voltage of a virtual power rail VPR, and may output the inverted voltage. The second inverter 312 may invert an output of the first inverter 311, and may output the inverted output as a mode signal MS. The second inverter 312 may output the mode signal MS having a logic low level in an active mode, and may output the mode signal MS having a logic high level in a standby mode.

Each of the first inverter 311 and the second inverter 312 may be coupled between a first power rail VDD and a second power rail VSS. Thus, the first inverter 311 and the second inverter 312 may be supplied with power and may operate during the standby mode. In some embodiments, the first inverter 311 and the second inverter 312 may be implemented with transistors having high threshold voltages, thereby reducing leakage current.

The first inverter 311 may be implemented as a stacked inverter. The first inverter 311 may include a first PMOS transistor MP1, a second PMOS transistor MP2, a first NMOS transistor MN1 and a second NMOS transistor MN2. The first PMOS transistor MP1 and the second PMOS transistor MP2 may be coupled in series between the first power rail VDD and an output node. The first NMOS transistor MN1 and the second NMOS transistor MN2 may be coupled in series between the output node and the second power rail VSS. In case that the first inverter 311 is the stacked inverter, the leakage current of the first inverter 311 may be further reduced even though the voltage of the virtual power rail VPR has a voltage level that is not sufficiently close to that of a first power supply voltage of the first power rail VDD.

The clock input unit may include a third inverter 321, a fourth inverter 322 and a control transistor 323. The third inverter 321 may receive a clock signal CLK, and output an inverted version of the clock signal CLK by inverting the clock signal CLK. The fourth inverter 322 may receive the inverted version of the clock signal CLK, and may output an internal clock signal ICLK by inverting the inverted version of the clock signal CLK. The control transistor 323 may control whether the internal clock signal ICLK is output or not in response to the mode signal MS received from the control signal input unit 310. For example, if the control transistor 323 receives the mode signal MS having a logic low level from the control signal input unit 310, the control transistor 323 may enable the internal clock signal ICLK to be output. If the control transistor 323 receives the mode signal MS having a logic high level from the control signal input unit 310, the control transistor 323 may pull down an output signal of the clock signal input unit 320 at a logic low level to deactivate the internal clock signal ICLK. Accordingly, the clock signal input unit 320 may not output the internal clock signal ICLK in the standby mode. The control transistor 323 may be a NMOS transistor MN3.

In some embodiments, the fourth inverter 322 may be implemented as a tri-state inverter. The fourth inverter 322 may output a signal in response to an inversion signal of the mode signal MS. For example, the fourth inverter 322 may be the tri-state inverter that outputs high impedance when the mode signal MS has a logic high level.

In some embodiments, each of the third inverter 321 and the fourth inverter 322 may be coupled between the first power rail VDD and the virtual power rail VPR. Thus, in the standby mode, the power is not supplied to the third inverter 321 and the fourth inverter 322, and thus the third inverter 321 and the fourth inverter 322 may not operate. Accordingly, power consumption may be reduced in the standby mode.

The flip-flop unit 330 may include a fifth inverter 331, a sixth inverter 332, a seventh inverter 333, an eighth inverter 334 and a ninth inverter 335. The fifth inverter 331 may receive input data D from a logic circuit 110 illustrated in FIG. 1, another retention flip-flop, or an external circuit, and may output an inverted version of the input data D. The sixth inverter 332 and the seventh inverter 333 may constitute a latch circuit, and may store the data output from the fifth inverter 331. The eighth inverter 334 and the ninth inverter 335 may output the data stored in the latch circuit as output data Q.

In some embodiments, the fifth inverter 331 may be a tri-state inverter that selectively outputs a signal in response to the internal clock signal ICLK. For example, the fifth inverter 331 may invert the input data D and may output the inverted data while the internal clock signal ICLK has a logic high level. The seventh inverter 333 may be a tri-state inverter that selectively outputs a signal in response to an inversion signal of the internal clock signal ICLK. Accordingly, the latch circuit including the sixth inverter 332 and the seventh inverter 333 may store or not store the output of the fifth inverter 331 in response to the inversion signal of the internal clock signal ICLK. For example, the latch circuit may store the data when the inversion signal of the internal clock signal ICLK has a logic high level. The eighth inverter 334 may be a tri-state inverter that selectively outputs a signal in response to the inversion signal of the internal clock signal ICLK. Accordingly, the flip-flop unit 330 may perform the flip-flop operation that temporarily stores and outputs the input data D in response to the internal clock signal ICLK.

In some embodiments, each of the fifth inverter 331, the sixth inverter 332, the seventh inverter 333, the eighth inverter 334 and the ninth inverter 335 may be coupled between the first power rail VDD and the virtual power rail VPR. Thus, in the standby mode, the power is not supplied to the fifth through the ninth inverter 331, 332, 333, 334 and 335, and thus the fifth through the ninth inverter 331, 332, 333, 334 and 335 may not operate. The flip-flop unit 330 may not perform the flip-flop operation in the standby mode, thereby reducing the power consumption.

The data retention unit 340 may include a tenth inverter 341 and an eleventh inverter 342. The tenth inverter 341 may receive and invert data D1 output from the eighth inverter 334, and the eleventh inverter 342 may invert data output from the tenth inverter 341. The eleventh inverter 342 may provide the inverted output data as an input of the tenth inverter 341. The tenth inverter 341 and the eleventh inverter 342 may constitute a latch circuit, and may store the received data D1. In some embodiments, the eleventh inverter 342 may be a tri-state inverter that selectively outputs the received data D1 in response to the internal clock signal ICLK. In some embodiments, the flip-flop unit 330 and the data retention unit 340 may be implemented as a master-slave flip-flop.

In some embodiments, each of the tenth inverter 341 and the eleventh inverter 342 may be coupled between the first power rail VDD and the second power rail VSS. Thus, in the standby mode, the tenth inverter 341 and the eleventh inverter 342 may be supplied with the power and may operate. The data retention unit 340 may stored and maintain the received data D1 in the standby mode. The data retention unit 340 may maintain the received data D1 until the operation mode transitions from the active mode to the standby mode. In some embodiments, the tenth inverter 341 and the eleventh inverter 342 may be implemented with transistors having high threshold voltages, thereby reducing leakage current.

As described above, the retention flip-flop 300 may reduce the power consumption since the clock signal input unit 320 and the flip-flop unit 330 may not operate in the standby mode. The retention flip-flop 300 may further reduce the power consumption since the control signal input unit 310 and the data retention unit 340 may be implemented with transistors having high threshold voltages.

Figure 4:
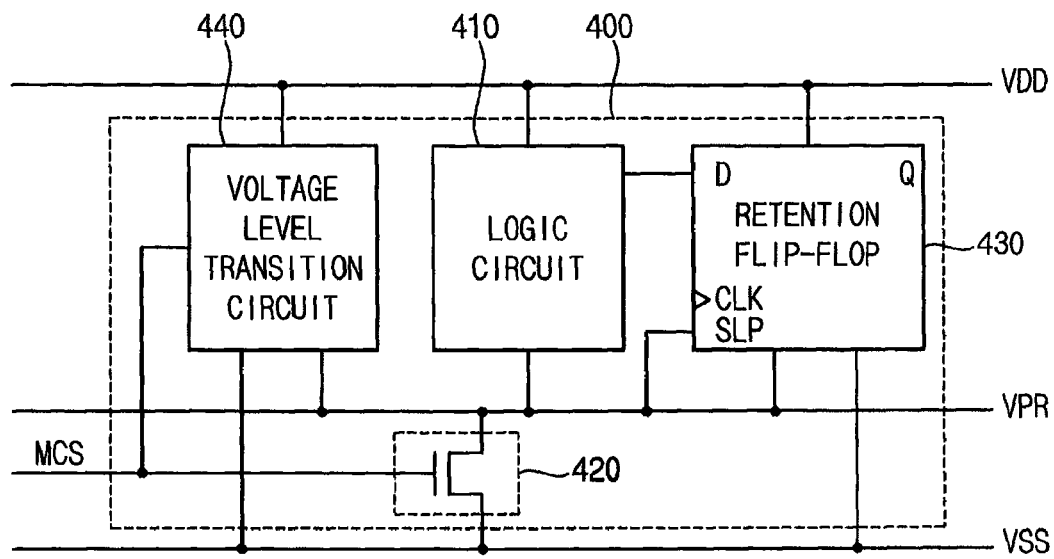
FIG. 4 is a block diagram illustrating a power gating circuit according to some example embodiments.

FIG. 4 is a block diagram illustrating a power gating circuit according to some example embodiments.

Referring to FIG. 4, the power gating circuit 400 includes a logic circuit 410, a switching element 420, a retention flip-flop 430 and a voltage level transition circuit 440. Compared with a power gating circuit 100 of FIG. 1, the power gating circuit 400 may further include the voltage level transition circuit 440.

The logic circuit 410 is coupled between a first power rail VDD and a virtual power rail VPR. The logic circuit 410 may perform logic operations in an active mode, and may not operate in a standby mode. The switching element 420 may selectively couple the virtual power rail VPR to a second power rail VSS. The switching element 420 may connect the virtual power rail VPR to the second power rail VSS in the active mode, and may disconnect the virtual power rail VPR from the second power rail VSS. The retention flip-flop 430 may receive a voltage of the virtual power rail VPR as a control signal at a control signal input terminal SLP, and may perform a flip-flop operation in the active mode and a data retention operation in the standby mode based on the voltage of the virtual power rail VPR.

The voltage level transition circuit 440 may couple the virtual power rail VPR to the first power rail VDD during a predetermined time in response to a mode control signal MCS. The voltage level transition circuit 440 may operate during a standby mode initialization time from when the mode control signal MCS transitions from a level indicating the active mode to a level indicating the standby mode. For example, when the mode control signal MCS transitions from a logic high level to a logic low level, the voltage level transition circuit 440 may couple the virtual power rail VPR to the first power rail VDD during the standby mode initialization time to reduce a time period during which the voltage of the virtual power rail VPR increases to a first power supply voltage of the first power rail VDD. By the voltage level transition circuit 440, the voltage of the virtual power rail VPR may rapidly increase to a logic high level, thereby preventing short circuit current that may possibly occur when an operation mode transitions from the active mode to the standby mode.

Figure 5:
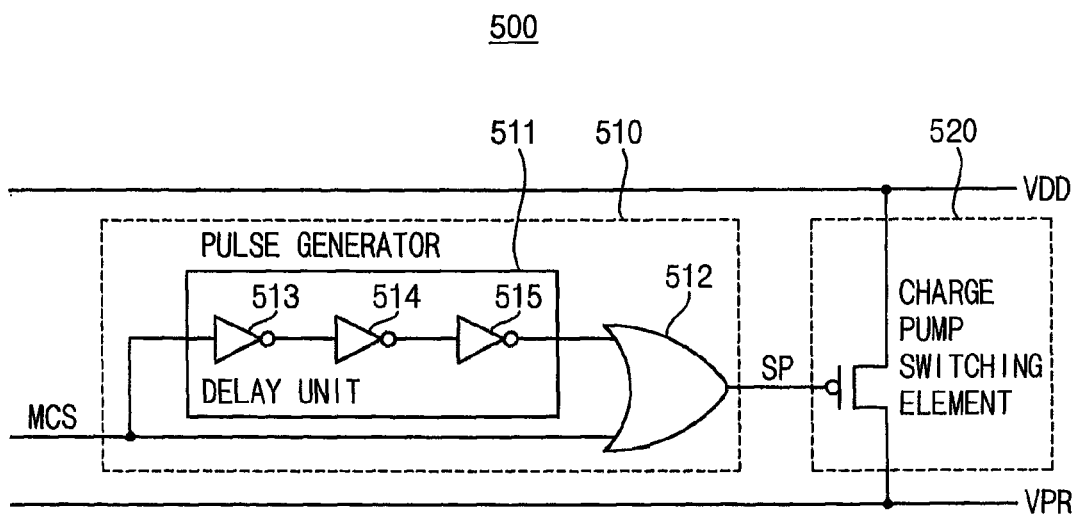
FIG. 5 is a circuit diagram illustrating a voltage level transition circuit included in a power gating circuit of FIG. 4.

FIG. 5 is a circuit diagram illustrating a voltage level transition circuit included in a power gating circuit of FIG. 4.

Referring to FIG. 5, a voltage level transition circuit 500 includes a pulse generator 510 and a charge pump switching element 520. The voltage level transition circuit 500 may be the voltage level transition circuit 440 included in the power gating circuit 400 of FIG. 4.

The pulse generator 510 may generate a pulse having a width corresponding to a standby mode initialization time. The pulse generator 510 may generate the pulse when a mode control signal MCS transitions from a first logic level indicating an active mode to a second logic level indicating a standby mode. The first logic level may be a logic high level, and the second logic level may be a logic low level. The standby mode initialization time may correspond to a time period during which a voltage of a virtual power rail VPR increases from a voltage level of a second power supply voltage of a second power rail to a voltage level of a first power supply voltage of a first power rail VDD.

The pulse generator 510 may include a delay unit 511 and an OR gate 512. The delay unit 511 delays and inverts a mode control signal MCS. The OR gate 512 may receive the mode control signal MCS at a first input terminal and the inverted mode control signal at a second input terminal. The OR gate 512 may generate a pulse signal SP by performing an OR operation on the mode control signal MCS and the delayed mode control signal. When the mode control signal MCS transitions from a logic high level to a logic low level, the delay unit 511 may delay the mode control signal MCS, and the OR gate 512 may output the pulse signal SP having a logic low level from when the mode control signal MCS transitions to a logic low level to when the inverted mode control signal from the delay unit 511 has a logic high level. The pulse width of the pulse signal SP may be determined by a delay time of the delay unit 511. The delay unit 511 may include at least one inverter 513, 514 and 515. The delay time of the delay unit 511 may be determined by a unit delay time of each inverter 513, 514 and 515 and the number of the inverters 513, 514 and 515.

The charge pump switching element 520 may couple the virtual power rail VPR to the first power rail VDD during a time period corresponding to the pulse width of the pulse signal SP. The charge pump switching element 520 may include a PMOS transistor. The charge pump switching element 520 may couple the virtual power rail VPR to the first power rail VDD while the pulse signal SP has a logic low level. For example, when the mode control signal MCS transitions from a logic high level to a logic low level, the pulse generator 510 may generate the pulse signal SP having a logic low level, and the charge pump switching element 520 may couple the virtual power rail VPR to the first power rail VDD.

As described above, when an operation mode transitions from the active mode to the standby mode, the voltage level transition circuit 500 couple the virtual power rail VPR to the first power rail VDD to provide charges to the virtual power rail VPR, thereby reducing a voltage increasing time of the virtual power rail VPR.

Figure 6:
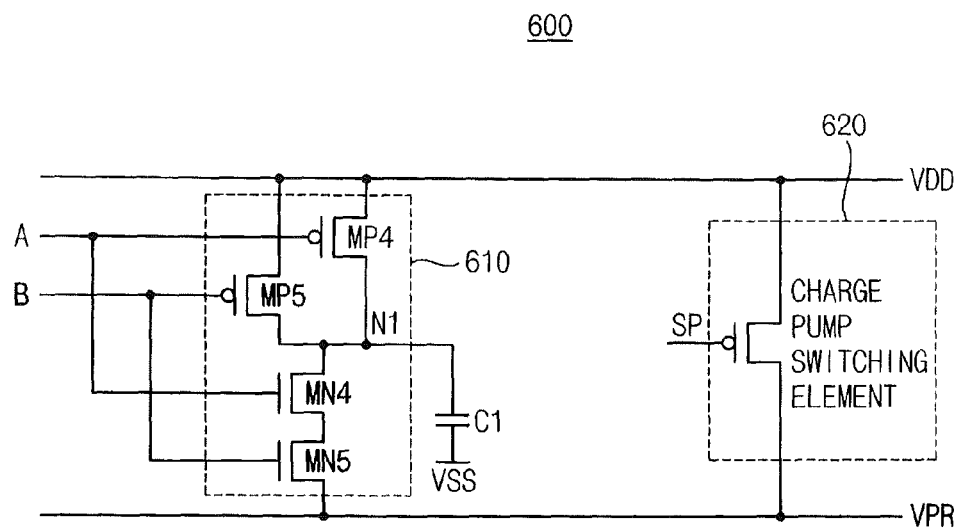
FIG. 6 is a diagram for describing calculation of capacitance of a power gating circuit according to some example embodiments.

FIG. 6 is a diagram for describing calculation of capacitance of a power gating circuit according to some example embodiments.

Referring to FIG. 6, a circuit model 600 where the power gating circuit is modeled includes a logic circuit 610, an output capacitor C1 and a charge pump switching element 620.

The charge pump switching element 620 couples a virtual power rail VPR to a first power rail VDD in response to a pulse signal SP such that the first power rail VDD provides charges to the virtual power rail VPR. Accordingly, a time period required for transitioning from an active mode to a standby mode may be reduced. The amount of charges provided to the virtual power rail VPR may increase in proportion to a pulse width of the pulse signal SP and a size (i.e., a channel width divided by a channel length) of the charge pump switching element 620. Thus, the pulse width of the pulse signal SP and/or the size of the charge pump switching element 620 may be determined such that a voltage of the virtual power rail VPR may increase to a first power supply voltage of the first power rail VDD.

The amount of charges required to increase the voltage of the virtual power rail VPR to the first power supply voltage may be calculated as follows:

$$Qr = Ct * Vdd,$$

where Qr represents the amount of required charges, Ct represents a total capacitance for the virtual power rail VPR, and Vdd represents the first power supply voltage.

The pulse width of the pulse signal SP and the size of the charge pump switching element 620 may be adjusted such that the amount of charges provided from the first power rail VDD to the virtual power rail VPR is larger than the amount of required charges (Qr). Thus, the calculation of the amount of required charges (Qr) is required to design an integrated circuit including the power gating circuit such that the voltage of the virtual power rail VPR may increase to the first power supply voltage within a predetermined time. The amount of required charges (Qr) is calculated based on the total capacitance (Ct).

The total capacitance (Ct) is calculated as the sum of a physical capacitance and a logical capacitance. The physical capacitance may be obtained using a simulator after a circuit design. The logical capacitance may vary according to states of circuits, and may be obtained by an appropriate circuit modeling.

For example, supposed that the logic circuit 410 of FIG. 4 includes a NAND gate 610 having first and second PMOS transistors MP4 and MP5 and first and second NMOS transistors MN4 and MN5 and an output capacitor C1, a logical capacitance of the logic circuit 410 may vary according to two inputs A and B. If a first input A or a second input B has a logic low level, a voltage at an output node N1 may have a logic high level. In this case, since the output capacitor C1 has been already charged, the output capacitor C1 need not to be charged by the charge pump switching element 620. If the first input A and the second input B have logic high levels, the voltage at an output node N1 may have a logic low level. In this case, charges through the charge pump switching element 620 from the first power rail VDD should be provided to the output capacitor C1 through the second NMOS transistor MN5 and the first NMOS transistor MN4. That is, when the voltage at the output node N1 has a logic low level, a capacitance of the output capacitor C1 may be added to the logical capacitance for the virtual power rail VPR.

Thus, the logical capacitance for the virtual power rail VPR may be calculated as follows:

$$Cl = \sum_i (1 - p_i) * C_i,$$

where Cl represents the logical capacitance for the virtual power rail VPR, $p_i$ represents a probability for a voltage at an output node of an i-th logic unit to have a logic high level, and $C_i$ represents an output capacitance of a capacitor coupled to the output node of the i-th logic circuit.

The logical capacitance for the virtual power rail VPR may be calculated by summing capacitances of capacitors coupled to output nodes multiplied by probabilities for voltages at the output nodes to have logic low levels. The probability ($p_i$) may be assumed as ½ to calculate the logical capacitance (Cl). Thus, the total capacitance for the virtual power rail VPR may be calculated based on the calculated logical capacitance, and the amount of required charges may be calculated based on the calculated total capacitance.

An amount of charges provided from the first power rail VDD through the charge pump switching element 620 to the virtual power rail VPR may be calculated as follows:

$$Qp = k * (W/L) * Tp,$$

where Qp represents the amount of charges provided through the charge pump switching element 620, k represents a proportional constant, W represents a channel width of the charge pump switching element 620, L represents a channel length of the charge pump switching element 620, and Tp represents a time period corresponding to the pulse width of the pulse signal SP.

The channel length (L) may be determined according to a design rule. The proportional constant (k) may vary based on a threshold voltage, and may be obtained from experiments or simulations.

As described above, since the amount of provided charges (Qp) is determined by the channel width (W) and the time period (Tp) corresponding to the pulse width, the voltage of the virtual power rail VPR may increase to the first power supply voltage within the predetermined time by adjusting the channel width and the pulse width.

Figure 7:
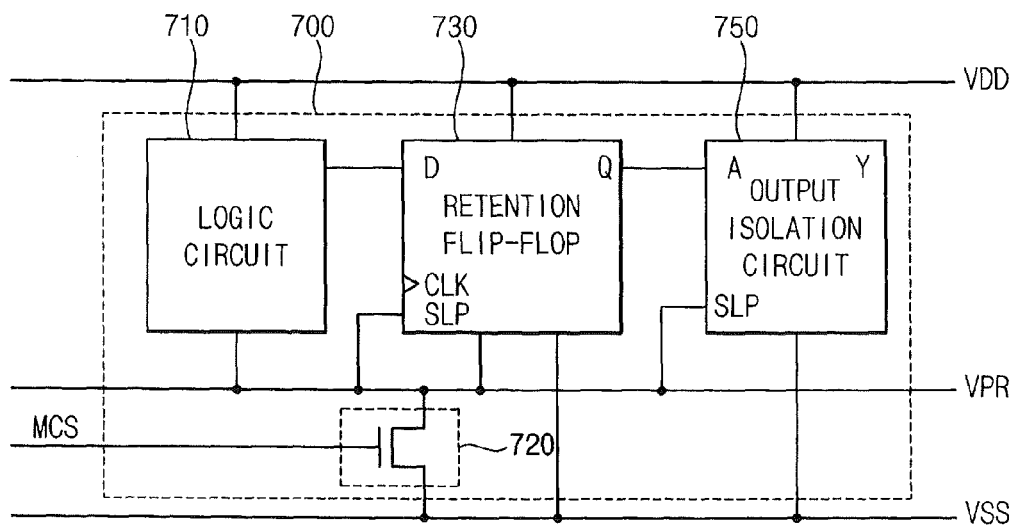
FIG. 7 is a block diagram illustrating a power gating circuit according to some example embodiments.

FIG. 7 is a block diagram illustrating a power gating circuit according to some example embodiments.

Referring to FIG. 7, a power gating circuit 700 includes a logic circuit 710, a switching element 720, a retention flip-flop 730 and an output isolation circuit 750. Compared with a power gating circuit 100 of FIG. 1, the power gating circuit 700 may further include the output isolation circuit 750.

The logic circuit 710 is coupled between a first power rail VDD and a virtual power rail VPR. The logic circuit 710 may perform logic operations in an active mode, and may not be supplied with power in a standby mode. The switching element 720 may selectively couple the virtual power rail VPR to a second power rail VSS. The switching element 720 may couple the virtual power rail VPR to the second power rail VSS in the active mode, and may disconnect the virtual power rail VPR from the second power rail VSS. The retention flip-flop 730 may receive a voltage of the virtual power rail VPR as a control signal at a control signal input terminal SLP, and may perform a flip-flop operation in the active mode and a data retention operation in the standby mode based on the voltage of the virtual power rail VPR.

The output isolation circuit 750 may receive the voltage of the virtual power rail VPR as a control signal at a control signal input terminal SLP. The output isolation circuit 750 may perform a data output operation in the active mode and a data retention operation in the standby mode based on the voltage of the virtual power rail VPR. For example, if the voltage of the virtual power rail VPR is substantially the same as a second power supply voltage of the second power rail VSS, the output isolation circuit 750 may perform the data output operation that receives data at a data input terminal A and outputs the received data at a data output terminal Y. If the voltage of the virtual power rail VPR is substantially the same as a first power supply voltage of the first power rail VDD, the output isolation circuit 750 may perform the data retention operation that maintains the data received at the data input terminal A.

As described above, in the power gating circuit 700 according to some example embodiments, since the retention flip-flop 730 and the output isolation circuit 750 may maintain the data in the standby mode, an initialization operation may not be required when an operation mode transitions from the standby mode to the active mode. Further, the power gating circuit 700 according to some example embodiments may reduce a wire length and wiring congestion since the retention flip-flop 730 and the output isolation circuit 750 receives the voltage of the virtual power rail VPR at the control input terminal SLP.

Figure 8:
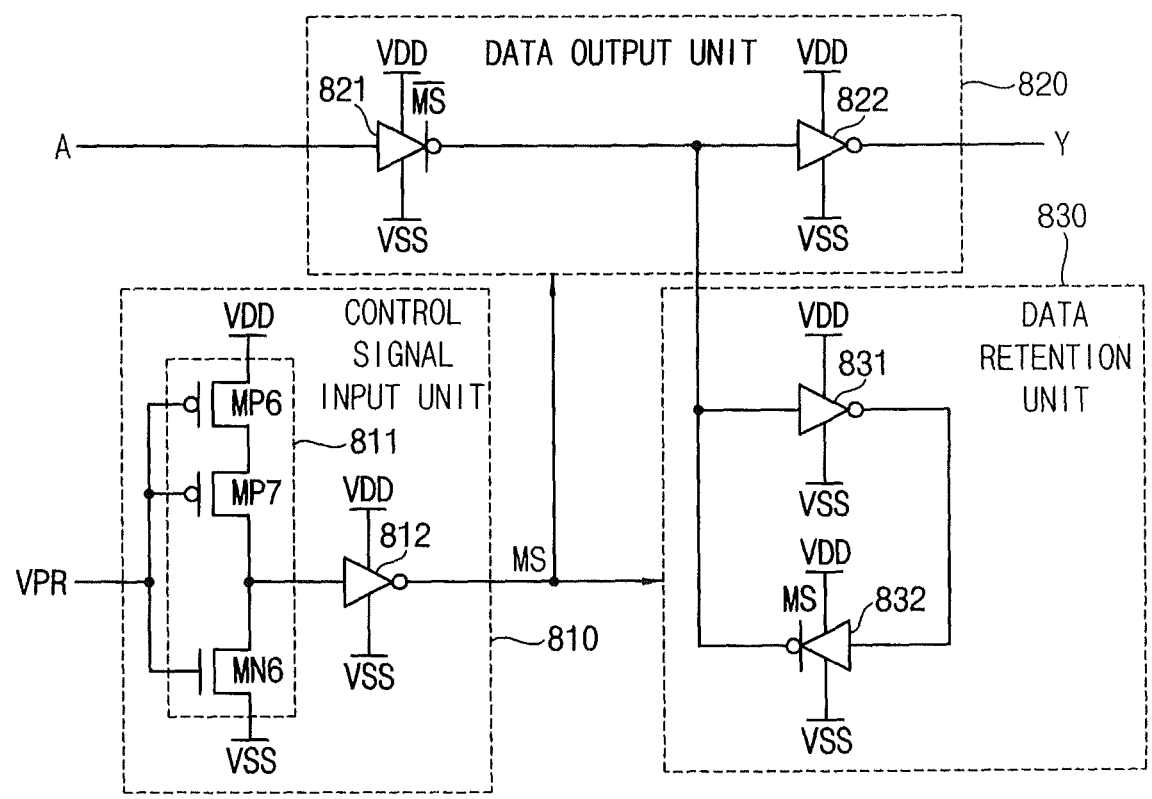
FIG. 8 is a circuit diagram illustrating an output isolation circuit included in a power gating circuit of FIG. 7.

FIG. 8 is a circuit diagram illustrating an output isolation circuit included in a power gating circuit of FIG. 7.

Referring to FIG. 8, an output isolation circuit 800 includes a control signal input unit 810, a data output unit 820 and a data retention unit 830. The output isolation circuit 800 may be an output isolation circuit 750 illustrated in FIG. 7.

The control signal input unit 810 may receive a voltage of a virtual power rail VPR as a control signal. The voltage of the virtual power rail VPR may have a logic low level in an active mode, and may have a logic high level in a standby mode. The control signal input unit 810 may generate a mode signal MS based on the voltage of the virtual power rail VPR. The mode signal MS may have substantially the same logic level as the voltage of the virtual power rail VPR. In some embodiments, the output isolation circuit 800 may be implemented without the control signal input unit 810, and the voltage of the virtual power rail VPR may be directly applied to the data output unit 820 and the data retention unit 830.

The data output unit 820 may selectively perform or not perform a data output operation in response to the mode signal MS. The data output unit 820 may receive input data A from a logic circuit 710 or a retention flip-flop 730 illustrated in FIG. 7. If the mode signal MS indicates the active mode, the data output unit 820 may output the input data A as output data Y. If the mode signal MS indicates the standby mode, the data output unit 820 may not operate.

The data retention unit 830 may selectively perform or not perform a data retention operation in response to the mode signal MS. The data retention unit 830 may maintain the data received at the data output unit 820. The data retention unit 830 may store the data from when the standby mode starts to when the standby mode ends. The data retention unit 830 may be coupled between a first power rail VDD and a second power rail VSS. Thus, the data retention unit 830 may be supplied with power in the standby mode, and may operate in the standby mode.

The control signal input unit 810 may include a first inverter 811 and a second inverter 812. The first inverter 811 may invert the voltage of the virtual power rail VPR. The second inverter 812 may invert an output of the first inverter 811, and may output the inverted output as the mode signal MS. The second inverter 812 may output the mode signal MS having a logic low level in the active mode, and may output the mode signal MS having a logic high level in the standby mode.

Each of the first inverter 811 and the second inverter 812 may be coupled between the first power rail VDD and the second power rail VSS. Thus, the first inverter 811 and the second inverter 812 may be supplied with power and may operate during the standby mode. The first inverter 811 may be implemented as a stacked inverter, thereby reducing leakage current.

The first inverter 811 may include first and second PMOS transistors MP6 and MP7 coupled in series between the first power rail VDD and an output node, and an NMOS transistor MN6 coupled between the output node and the second power rail VSS. Since the first inverter 811 includes one NMOS transistor MN6, the control signal input unit 810 may rapidly generate the mode signal MS indicating the standby mode when the voltage of the virtual power rail VPR transitions from a logic low level indicating the active mode to a logic high level indicating the standby mode.

The data output unit 820 may include a third inverter 821 and a fourth inverter 822. The third inverter 821 may invert input data A. The fourth inverter 822 may invert an output of the third inverter 821, and may output the inverted output as the output data Y to an external circuit.

In some embodiments, the third inverter 821 may be implemented as a tri-state inverter that operates in response to the mode signal MS. The third inverter 821 may invert and output the input data A when the mode signal has a logic low level. The third inverter 821 may output high impedance when the mode signal MS has a logic high level. Thus, the data output unit 820 may selectively perform the data output operation in response to the mode signal MS.

In some embodiments, the third inverter 821 and a fourth inverter 822 may be implemented with transistors having high threshold voltages, thereby reducing leakage current. If the third inverter 821 is implemented with transistors having high threshold voltages, an operation time of the third inverter 821 may increase and the output of the third inverter 821 may be relatively slowly applied to the data retention unit 830. Accordingly, even though the mode signal MS does not rapidly transition to a logic high level when an operation mode transitions from the active mode to the standby mode, the data retention unit 830 may store exact data since the output of the third inverter 821 are slowly applied.

The data retention unit 830 may include a fifth inverter 831 and a sixth inverter 832. The fifth inverter 831 may invert the output of the third inverter 821, and the sixth inverter 832 may invert an output of the fifth inverter 831. The sixth inverter 832 may provide an output as an input of the fifth inverter 831. The fifth inverter 831 and the sixth inverter 832 may constitute a latch circuit. In some embodiments, the sixth inverter 832 may be a tri-state inverter that selectively outputs data in response to the mode signal MS.

Each of the fifth inverter 831 and the sixth inverter 832 may be coupled between the first power rail VDD and the second power rail VSS. Thus, in the standby mode, the fifth inverter 831 and the sixth inverter 832 may be supplied with the power and may operate. In some embodiments, the fifth inverter 831 and the sixth inverter 832 may be implemented with transistors having high threshold voltages, thereby reducing leakage current.

Figure 9:
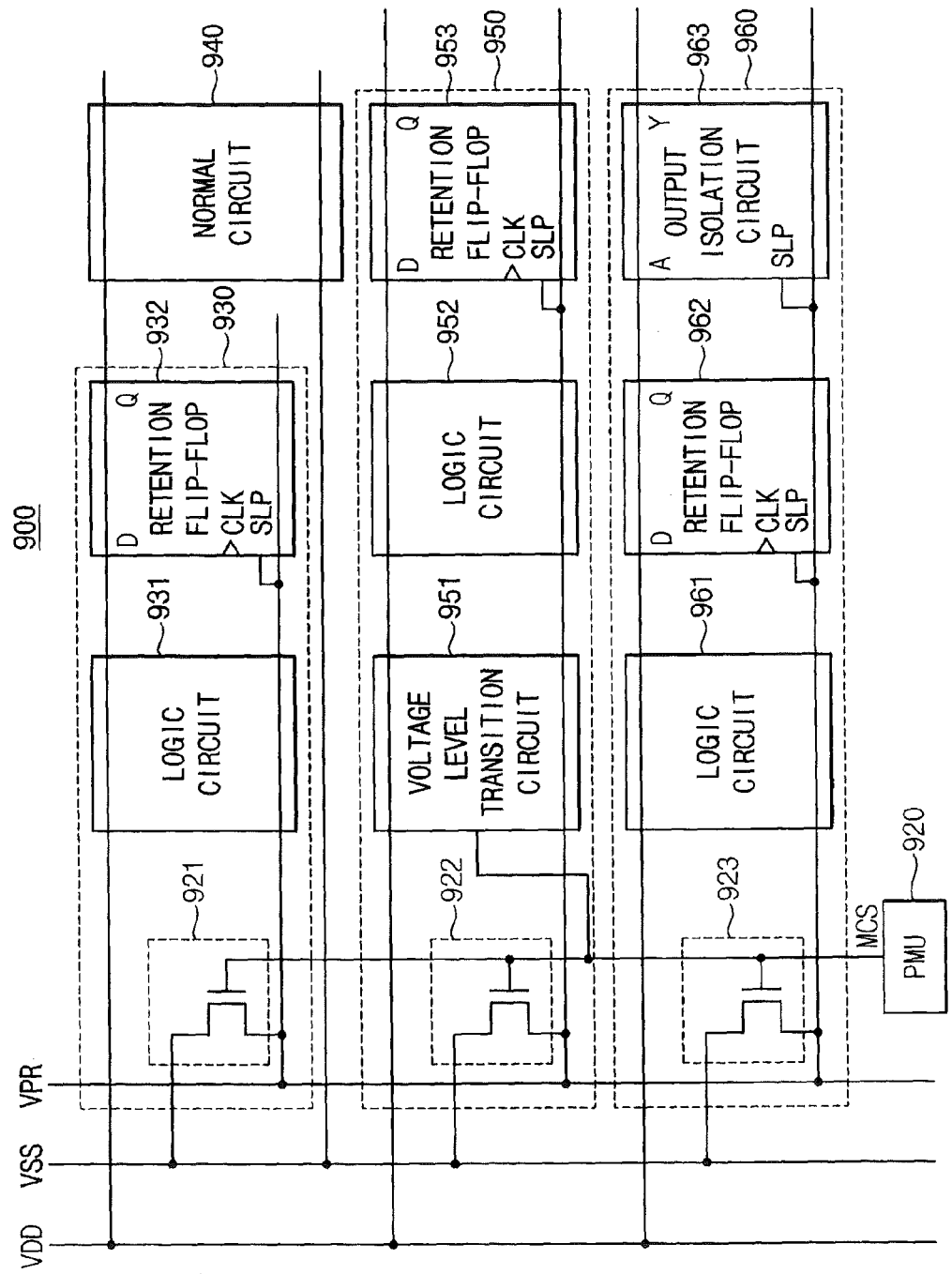
FIG. 9 is a block diagram illustrating an integrated circuit according to some example embodiments.

FIG. 9 is a block diagram illustrating an integrated circuit according to some example embodiments.

Referring to FIG. 9, an integrated circuit 900 includes a first power rail VDD, a second power rail VSS, a virtual power rail VPR, a power management unit 920, at least one power gating circuit 930, 950 and 960 and a normal circuit 940.

The first power rail VDD provides a first power supply voltage, and the second power rail VSS provides a second power supply voltage. The virtual power rail VPR may be selectively coupled to the second power rail VSS by at least one switching element 921, 922 and 923. A voltage of the virtual power rail VPR may have a voltage level ranging from a voltage level of the first power supply voltage to a voltage level of the second power supply voltage.

The power management unit 920 generates a mode control signal MCS indicating an active mode or a standby mode. Switching elements 921, 922 and 923 may selectively couple the virtual power rail VPR to the second power rail VSS in response to mode control signal MCS applied from the power management unit 920. A voltage of the virtual power rail VPR may be substantially the same as the second power supply voltage in the active mode, and may be substantially the same as the first power supply voltage in the standby mode.

The normal circuit 940 may be coupled between the first power rail VDD and the second power rail VSS, and the power gating circuits 930, 950 and 960 may be coupled between the first power rail VDD and the second power rail VSS. The power gating circuits 930, 950 and 960 may not be supplied with power in the standby mode, thereby reducing power consumption. Logic circuits 931, 952 and 961 may not be supplied with power in the standby mode. At least one voltage level transition circuit 951 may reduce a transition time from the active mode to the standby mode. At least one retention flip-flop 932, 953 and 962 and at least one output isolation circuit 963 may receive the voltage of the virtual power rail VPR instead of the mode control signal MCS. Accordingly, the integrated circuit 900 according to some example embodiments may have a reduced wire length.

The integrated circuit 900 may be applicable to any integrated circuit or a semiconductor device. For example, the integrated circuit 900 may be applied to a system-on-chip (SoC), a microprocessor, a digital signal processor, a radio frequency (RF) circuit, a memory device, a microcontroller, an input/output controller, or the like.

Figure 10:
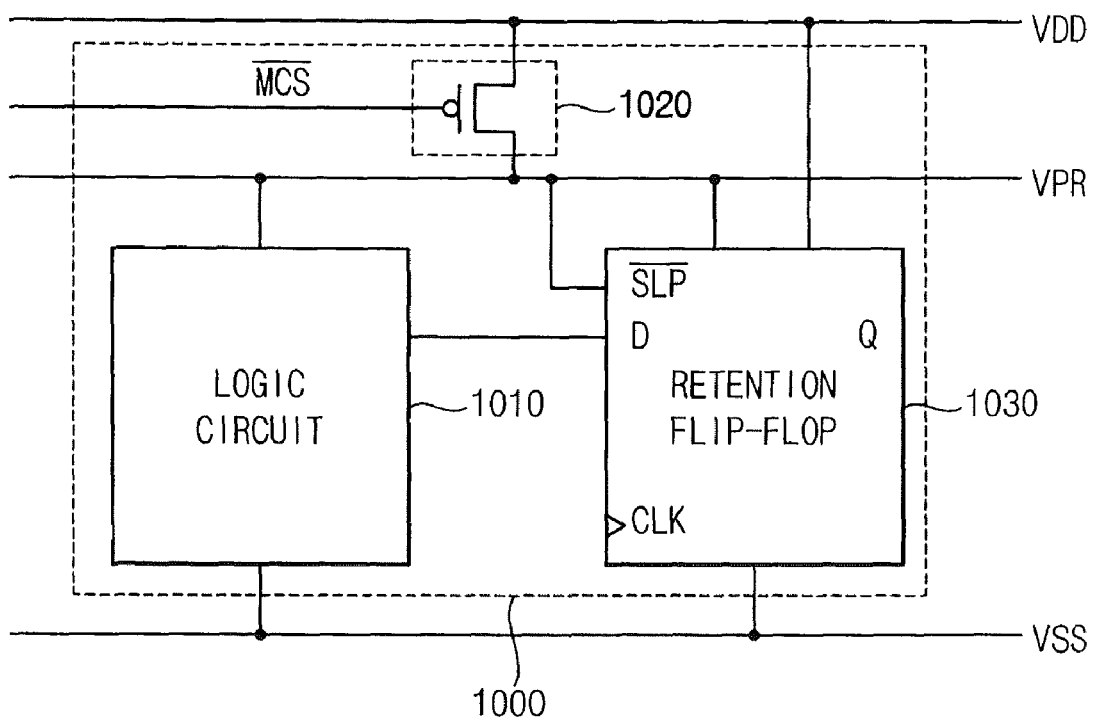
FIG. 10 is a block diagram illustrating a power gating circuit according to some example embodiments.

FIG. 10 is a block diagram illustrating a power gating circuit according to some example embodiments.

Referring to FIG. 10, a power gating circuit 1000 includes a logic circuit 1010, a switching element 1020 and a retention flip-flop 1030.

The switching element 1020 may be a header. A virtual power rail VPR may be selectively coupled to a first power rail VDD. A voltage of the virtual power rail VPR may be substantially the same as a first power supply voltage of the first power rail VDD in an active mode, and may be substantially the same as a second power supply voltage of a second power rail VSS in a standby mode.

The logic circuit may be coupled between the virtual power rail VPR and the second power rail VSS, thereby reducing power consumption. The retention flip-flop 1030 may receive the voltage of the virtual power rail VPR, thereby reducing a wire length and wiring congestion.

FIG. 11 is a diagram illustrating simulation results for a power gating circuit according to some example embodiments.

In FIG. 11, simulation results for wire lengths are illustrated when a conventional power gating circuit and a power gating circuit according to some example embodiments are applied to benchmark circuits of international symposium on circuits and systems (ISCAS) and international test conference (ITC).

Referring to FIG. 11, compared with the conventional power gating circuit, the power gating circuit according to some example embodiments may have a wire length reduced by about 8.6% in average.

As described above, the power gating circuit and the integrated circuit according to some example embodiments need not a buffer for a mode control signal and may reduce a wire length for the mode control signal by using a voltage of a virtual power rail. Further, the power gating circuit and the integrated circuit according to some example embodiments may efficiently reduce leakage current and power consumption.

The power gating circuit and the integrated circuit according to some example embodiments may be employed in any integrated circuit or any semiconductor device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An integrated circuit device, comprising:
   a logic circuit electrically coupled to a first power rail and a virtual power rail;
   a switching circuit electrically coupled to the virtual power rail and a second power rail, said switching circuit configured to electrically couple the virtual power rail to the second power rail to thereby power said logic circuit during an active mode of operation and further configured to electrically decouple the virtual power rail from the second power rail to thereby disable said logic circuit during a standby mode of operation;
   a data retention circuit electrically coupled to an output of said logic circuit, said data retention circuit configured to latch data received from the output of said logic circuit during the active mode of operation and further configured to hold previously latched data therein during the standby mode of operation while concurrently blocking changes in the output of said logic circuit from becoming latched therein; and
   a voltage level transition circuit responsive to a mode control signal, said voltage level transition circuit configured to electrically couple the virtual power rail to the first power rail in response to a transition of the mode control signal that reflects commencement of the standby mode of operation and further configured to decouple the virtual power rail from the first power rail in response to a transition of the mode control signal that reflects commencement of the active mode of operation.

2. The device of claim 1, wherein said data retention circuit is electrically connected to the first power rail, the virtual power rail and the second power rail.

3. The device of claim 2, wherein said data retention circuit is configured to generate an internal clock signal in response to a voltage of the virtual power rail received at a control input thereon.

4. The device of claim 3, wherein said data retention circuit is further configured to clamp the internal clock signal at a first logic level during the standby mode of operation.

5. The device of claim 2, wherein said data retention circuit comprises at least one inverter therein having a first power supply terminal electrically connected to the first power rail and a second power supply terminal electrically connected to the virtual power rail.

6. A power gating circuit, comprising:
   a logic circuit coupled between a first power rail and a virtual power rail;
   a switching element configured to selectively couple the virtual power rail to a second power rail in response to a mode control signal indicating an active mode or a standby mode; and
   a retention flip-flop configured to selectively perform a flip-flop operation or a data retention operation in response to a voltage of the virtual power rail, said retention flip-flop comprising:
   a control signal input unit configured to receive the voltage of the virtual power rail, and configured to generate a mode signal based on the voltage of the virtual power rail;
   a clock signal input unit configured to receive a clock signal, and configured to selectively output the clock signal as an internal clock signal in response to the mode signal;
   a flip-flop unit configured to perform the flip-flop operation when the clock signal input unit outputs the internal clock signal; and
   a data retention unit configured to perform the data retention operation when the clock signal input unit does not output the internal clock signal.

7. The power gating circuit of claim 6, wherein the switching element connects the virtual power rail to the second power rail when the mode control signal indicates the active mode, and disconnects the virtual power rail from the second power rail when the mode control signal indicates the standby mode.

8. The power gating circuit of claim 6, wherein the control signal input unit comprises:
   a first inverter configured to invert the voltage of the virtual power rail; and
   a second inverter configured to invert an output of the first inverter, and configured to output the inverted output as the mode signal.

9. The power gating circuit of claim 8, wherein the first inverter comprises:
   first and second PMOS transistors coupled in series between the first power rail and an output node; and
   first and second NMOS transistors coupled in series between the output node and the second power rail.

10. The power gating circuit of claim 6, wherein the clock signal input unit comprises:
    a first inverter coupled between the first power rail and the virtual power rail, and configured to invert the clock signal;
    a second inverter coupled between the first power rail and the virtual power rail, configured to invert an output of the first inverter, and configured to output the inverted output as the internal clock signal at a node; and
    an NMOS transistor configured to selectively couple the node to the second power rail in response to the mode signal.

11. The power gating circuit of claim 6, wherein the flip-flop unit is coupled between the first power rail and the virtual power rail, and the data retention unit is coupled between the first power rail and the second power rail.

12. The power gating circuit of claim 11, wherein the flip-flop unit is not supplied with power and the data retention unit is supplied with the power when the voltage of the virtual power rail is substantially the same as a first power supply voltage provided through the first power rail.

13. A power gating circuit, comprising:
    a logic circuit coupled between a first power rail and a virtual power rail;
    a switching element configured to selectively couple the virtual power rail to a second power rail in response to a mode control signal indicating an active mode or a standby mode;
    a retention flip-flop configured to selectively perform a flip-flop operation or a data retention operation in response to a voltage of the virtual power rail; and
    a voltage level transition circuit configured to couple the virtual power rail to the first power rail during a predetermined time in response to the mode control signal when the mode control signal transitions from a first logic level indicating the active mode to a second logic level indicating the standby mode.

14. The power gating circuit of claim 13, wherein the voltage level transition circuit comprises:
    a pulse generator configured to generate a pulse having a width corresponding to the predetermined time in response to the mode control signal; and
    a charge pump switching element configured to couple the virtual power rail to the first power rail in response to the pulse generated by the pulse generator.

15. The power gating circuit of claim 14, wherein the pulse generator comprises:
a delay unit configured to delay the mode control signal; and
a logic gate configured to generate the pulse by performing a logical operation on the mode control signal and the delayed mode control signal.

16. The power gating circuit of claim 14, wherein the width of the pulse is adjusted based on an amount of charges that are required for the voltage of the virtual power rail to reach a first power supply voltage provided through the first power rail.

17. A power gating circuit, comprising:
a logic circuit coupled between a first power rail and a virtual power rail;
a switching element configured to selectively couple the virtual power rail to a second power rail in response to a mode control signal indicating an active mode or a standby mode;
a retention flip-flop configured to selectively perform a flip-flop operation or a data retention operation in response to a voltage of the virtual power rail; and
an output isolation circuit configured to selectively perform a data output operation or the data retention operation in response to the voltage of the virtual power rail.

18. The power gating circuit of claim 17, wherein the output isolation circuit performs the data output operation when the voltage of the virtual power rail is substantially the same as a second power supply voltage provided through the second power rail, and the output isolation circuit performs the data retention operation when the voltage of the virtual power rail is substantially the same as a first power supply voltage provided through the first power rail.

* * * * *